(12) United States Patent
Kim

(10) Patent No.: US 10,570,500 B2
(45) Date of Patent: Feb. 25, 2020

(54) SENSOR COVER LAMINATES FOR VEHICLE ADJUSTING COLOR AND PENETRATING ELECTRONIC WAVES

(71) Applicant: Hun Rae Kim, Daejeon (KR)

(72) Inventor: Hun Rae Kim, Daejeon (KR)

( * ) Notice: Subject to any disclaimer, the term of this patent is extended or adjusted under 35 U.S.C. 154(b) by 0 days.

(21) Appl. No.: 15/763,009

(22) PCT Filed: Sep. 13, 2016

(86) PCT No.: PCT/KR2016/010326
§ 371 (c)(1),
(2) Date: Mar. 23, 2018

(87) PCT Pub. No.: WO2017/052134
PCT Pub. Date: Mar. 30, 2017

(65) Prior Publication Data
US 2018/0291496 A1  Oct. 11, 2018

(30) Foreign Application Priority Data

Sep. 23, 2015 (KR) .................. 10-2015-0134924
Aug. 26, 2016 (KR) .................. 10-2016-0109354

(51) Int. Cl.
*C23C 14/06* (2006.01)
*C23C 14/28* (2006.01)
(Continued)

(52) U.S. Cl.
CPC ............ *C23C 14/0629* (2013.01); *B05D 1/62* (2013.01); *B60R 13/005* (2013.01); *B60R 19/52* (2013.01);
(Continued)

(58) Field of Classification Search
CPC ...... C23C 14/0629; C23C 14/28; C23C 14/18
(Continued)

(56) References Cited

U.S. PATENT DOCUMENTS 5,144,498 A * 9/1992 Vincent .................. G01J 3/12
250/226
5,373,305 A * 12/1994 Lepore, Jr. ............. H01Q 1/002
244/121
(Continued)

FOREIGN PATENT DOCUMENTS

JP       2006-153976 A    6/2006
KR  10-1999-0072943 A    9/1999
(Continued)

OTHER PUBLICATIONS

International Search Report (PCT/ISA/210) dated Dec. 8, 2016, by the Korean Patent Office as the International Searching Authority for International Application No. PCT/KR2016/010326.
Written Opinion (PCT/ISA/237) dated Dec. 8, 2016, by the Korean Patent Office as the International Searching Authority for International Application No. PCT/KR2016/010326.

*Primary Examiner* — Tahseen Khan
(74) *Attorney, Agent, or Firm* — Buchanan Ingersoll & Rooney PC

(57) ABSTRACT

The present invention provides a stacked body including a germanium layer, an organic material layer, a zinc compound layer, and the like, thereby exhibiting a specific color and glossiness, transmitting electromagnetic waves, and having excellent water resistance, and more particularly, a stacked body including a substrate and a deposition layer formed on the substrate, wherein the deposition layer includes the organic material layer made of an organic material, the zinc compound layer made of zinc sulfide (ZnS) or zinc selenium (ZnSe), and the germanium layer made of germanium (Ge) or a germanium alloy.

15 Claims, 10 Drawing Sheets

(51) Int. Cl.
| | |
|---|---|
| *B60R 13/00* | (2006.01) |
| *B60R 19/52* | (2006.01) |
| *H01Q 1/42* | (2006.01) |
| *H01Q 1/32* | (2006.01) |
| *B05D 1/00* | (2006.01) |
| *C23C 14/18* | (2006.01) |
| *H01Q 1/02* | (2006.01) |
| *B60R 13/04* | (2006.01) |

(52) U.S. Cl.
CPC .............. *C23C 14/18* (2013.01); *C23C 14/28* (2013.01); *H01Q 1/02* (2013.01); *H01Q 1/3233* (2013.01); *H01Q 1/42* (2013.01); *H01Q 1/422* (2013.01); *B60R 13/04* (2013.01); *B60R 2019/525* (2013.01); *H01Q 1/3291* (2013.01)

(58) Field of Classification Search
USPC .......................................................... 428/213
See application file for complete search history.

(56) References Cited

U.S. PATENT DOCUMENTS

| | | | |
|---|---|---|---|
| 5,373,306 A * | 12/1994 | Amore | ................... H01Q 1/002 343/872 |
| 6,270,832 B2 | 8/2001 | Honda et al. | |
| 7,291,223 B2 | 11/2007 | Lazarev | |
| 9,114,760 B2 | 8/2015 | Mayer | |
| 2001/0003605 A1 | 6/2001 | Honda et al. | |
| 2005/0103258 A1 | 5/2005 | Lazarev | |
| 2012/0119961 A1 | 5/2012 | Mayer | |
| 2019/0173195 A1* | 6/2019 | Kim | ................... H01Q 21/0006 |

FOREIGN PATENT DOCUMENTS

| | | |
|---|---|---|
| KR | 10-2002-0091535 A | 12/2002 |
| KR | 10-2006-0064680 A | 6/2006 |
| KR | 10-2014-0001928 A | 1/2014 |

* cited by examiner

SENSOR COVER LAMINATES FOR VEHICLE ADJUSTING COLOR AND PENETRATING ELECTRONIC WAVES

TECHNICAL FIELD

The present invention relates to a stacked body, and more particularly, to a stacked body including a germanium layer, an organic material layer, a zinc compound layer, and the like, thereby exhibiting a specific color and glossiness, transmitting electromagnetic waves, and having excellent water resistance. The present invention corresponds to B32B 5 in the international patent classification (IPC).

BACKGROUND ART

A sensor cover is a part for covering an antenna of a sensor and installed to protect a general antenna from collision, debris, and strong wind pressure. Accordingly, a sensor cover is required to have strength to be able to withstand wind pressure, friction with air, hail, and the like, weather resistance, lightness in weight, an excellent electromagnetic wave transmittance, and the like.

However, in some cases, there is a limitation in designing a sensor cover in terms of a design. An auto cruise control system refers to an apparatus in which when a driver operates a switch at a desired speed, a computer stores the vehicle speed to allow the driver to drive the vehicle without pressing an acceleration pedal. The auto cruise control system controls a distance between the vehicles as well as the vehicle speed, and a sensor installed in the system may detect the distance between the vehicles. A sensor for detecting the distance between the vehicles needs to be installed at the front of the vehicle, and a sensor cover capable of covering the antenna of the sensor is required aesthetically. In addition, the sensor cover for vehicles needs to be in harmony with the surrounding thereof.

FIG. 1 illustrates a perspective view showing an example of a vehicle in which a sensor is installed inside the front side. The sensor cover for vehicles may be provided in a front grille or at the rear side of an emblem, or may be the emblem itself. FIGS. 2 and 3 illustrate perspective views showing examples of the front grille provided with the sensor cover for vehicles. In FIG. 2, the sensor cover for vehicles is provided at the center of the front grille. In addition, in FIG. 3, the sensor cover for vehicles itself becomes the emblem. Generally, the front grille exhibits black and/or silver color. The emblem mostly exhibits the black and/or silver color. Accordingly, when the sensor cover for vehicles is made of transparent material in order to secure electromagnetic wave transmissivity, the sensor cover for vehicles is difficult to be in harmony with the surrounding thereof. Furthermore, it is not aesthetically good that the interior of the vehicle is shown through the transparent sensor cover. However, when the sensor cover for vehicles is made of the material exhibiting black or silver color, the sensor cover for vehicles is continuous with the front grille and/or the emblem therearound, but there is a problem of securing the electromagnetic wave transmissivity.

In the related art, indium (In) or tin (Sn), which are materials capable of transmitting the electromagnetic waves while exhibiting a metallic color and glossiness, were used as a sensor cover material. As the prior art related thereto, there is Japanese Patent Registration No. 3366299 (hereinafter referred to as Prior Art 1).

SUMMARY OF INVENTION

Technical Problem

A technical object to be achieved in the present invention is to solve a problem that indium used in Prior Art 1 exhibits a metallic color and glossiness, but is easily oxidized or peeled and thus, reliability is poor.

Technical objects to be achieved in the present invention are not limited to the aforementioned objects, and other technical objects which are not described above will be apparently understood to those skilled in the art from the following disclosure of the present invention.

Solution to Problem

The present invention contrived to solve the technical objects provides a stacked body including a substrate and a deposition layer formed on the substrate, in which the deposition layer includes: an organic material layer made of an organic material; a first zinc compound layer deposited on the upper surface of the organic material layer and made of zinc sulfide (ZnS) or zinc selenide (ZnSe); a germanium layer deposited on the upper surface of the first zinc compound layer and made of germanium (Ge) or a germanium alloy; and a second zinc compound layer deposited on the upper surface of the germanium layer and made of the zinc sulfide or the zinc selenide. The stacked body has excellent reliability and excellent electromagnetic wave transmissivity.

Advantageous Effects of Invention

The present invention has a first effect that the water resistance and the moisture resistance are excellent and thus the reliability is excellent, a second effect that it is well in harmony with the surrounding of the sensor cover for vehicles in terms of colors and glossiness as compared with indium or tin, a third effect that the electromagnetic wave transmissivity is excellent, a fourth effect that it is thin and light, and a fifth effect that the manufacturing price competitiveness is high because indium, which is a rare metal, or an indium alloy is not used.

According to the embodiment of the present invention, the effects of the present invention are not limited to the above effects and it should be understood that the effects include all effects inferable from the configuration of the invention described in the detailed description or appended claims of the present invention.

DESCRIPTION OF EMBODIMENTS

Figure 1:
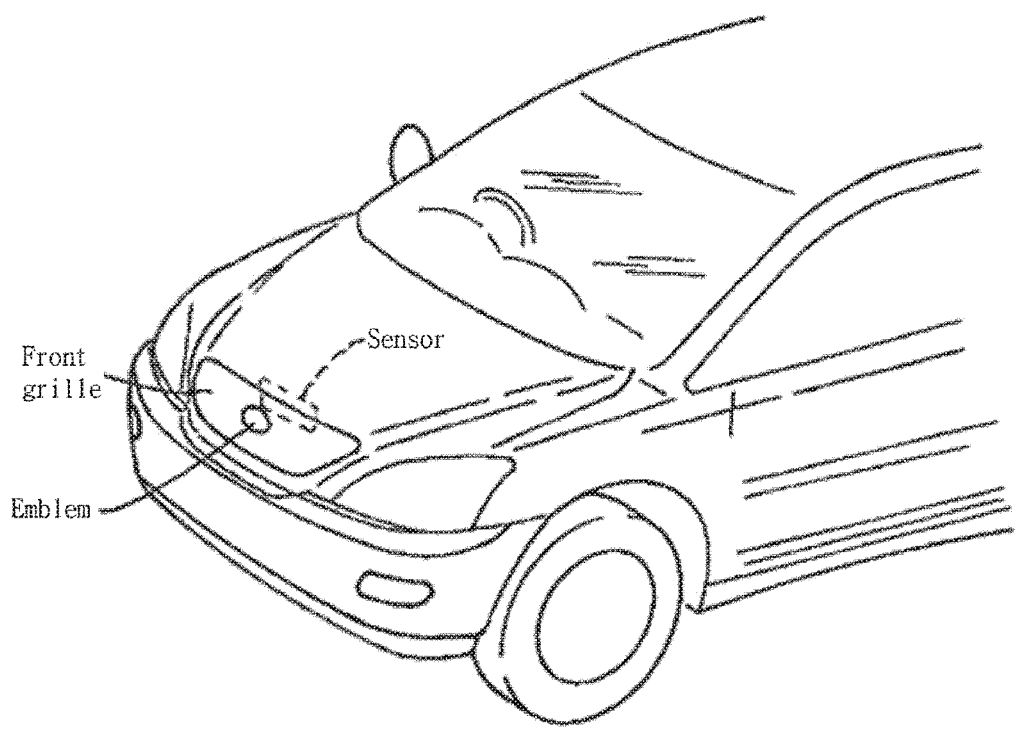
FIG. 1 is a perspective view showing an example of a vehicle provided with a sensor.
Figure 2:
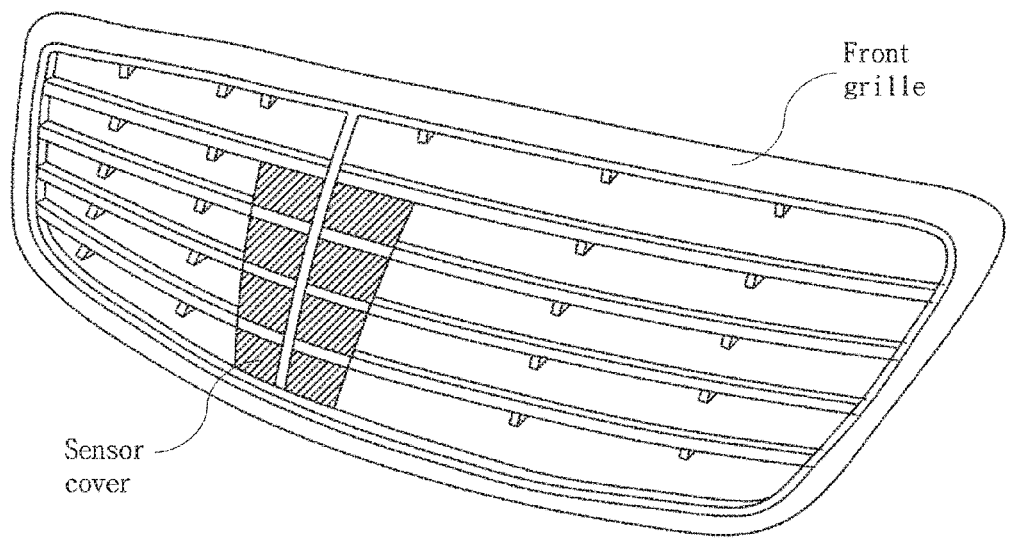
FIG. 2 is a perspective view showing an example of a front grille provided with a sensor cover for vehicles.
Figure 3:
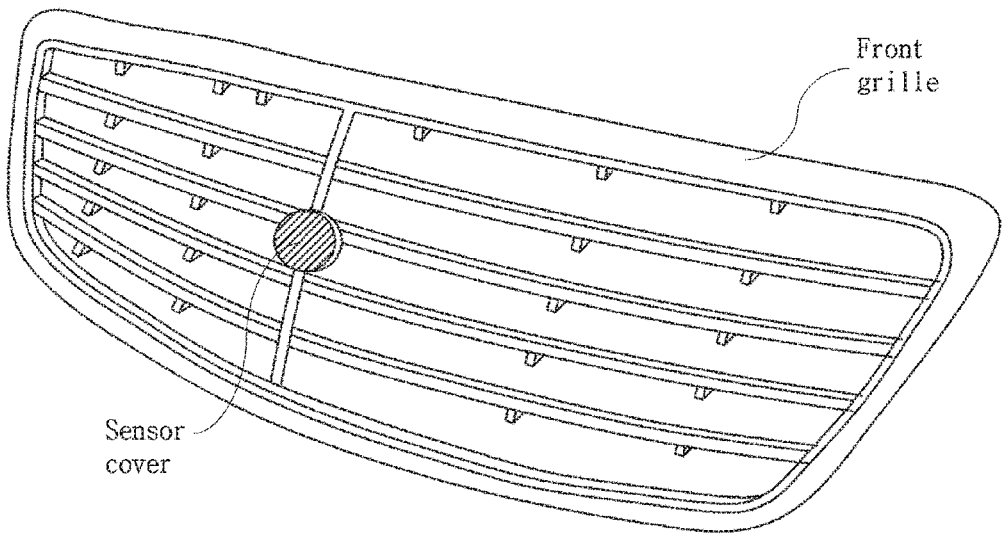
FIG. 3 is a perspective view showing an example of the front grille provided with the sensor cover for vehicles.

The present invention contrived to solve the problems provides a stacked body including a substrate and a deposition layer formed on the substrate, in which the deposition layer includes: an organic material layer made of an organic material; a first zinc compound layer deposited on the upper surface of the organic material layer and made of zinc sulfide (ZnS) or zinc selenide (ZnSe); a germanium layer deposited on the upper surface of the first zinc compound layer and made of germanium (Ge) or a germanium alloy; and a second zinc compound layer deposited on the upper surface of the germanium layer and made of the zinc sulfide or the zinc selenide.

In addition, according to an embodiment of the present invention, the deposition layer may further include a chromium oxide layer deposited on the upper surface of the second zinc compound layer and made of chromium oxide (CrOx).

In addition, according to an embodiment of the present invention, the thickness of the organic material layer may be 50 to 400 Å.

In addition, according to an embodiment of the present invention, the thickness of the first zinc compound layer may be 100 to 600 Å.

In addition, according to an embodiment of the present invention, the thickness of the germanium layer may be 150 to 800 Å.

In addition, according to an embodiment of the present invention, the thickness of the second zinc compound layer may be 100 to 600 Å.

In addition, according to an embodiment of the present invention, the thickness of the chromium oxide layer may be 50 to 400 Å.

In addition, according to an embodiment of the present invention, the germanium alloy may be made of 50 to 99 wt % of the germanium and 1 to 50 wt % of at least one element belonging to Groups 3B to 5A of the periodic table.

In addition, according to an embodiment of the present invention, the substrate may be made of at least one material selected from the group consisting of polycarbonate (PC), polymethylmethacrylate (PMMA), polyethylene terephthalate (PET), polyethylene naphthalate (PEN), polyimide (PI), cycloolefin polymer (COP), polyether sulfone (PES), polyetheretherketone (PEEK), polyarylate (PAR), an ABS resin, and a silicone resin.

In addition, according to the embodiment of an present invention, the stacked body may further include a primer coating layer located between the substrate and the deposition layer.

In addition, according to an embodiment of the present invention, the stacked body may further include a black shield coating layer formed on the upper surface of the deposition layer.

Further, the present invention provides a stacked body including a deposition layer further including a ceramic layer made of ceramic on the lowermost layer and the substrate.

In addition, according to an embodiment of the present invention, the ceramic layer may include at least one high refractive index layer having a refractive index of 1.7 to 2.6 and at least one low refractive index layer having a refractive index of 1.4 or more and less than 1.7, and the high refractive index layers and the low refractive index layers may be alternately deposited.

In addition, according to an embodiment of the present invention, the ceramic layer may be formed by depositing a first high refractive index layer, a first low refractive index layer, a second high refractive index layer, and a second low refractive index layer in sequence.

In addition, according to an embodiment of the present invention, the high refractive index layer and the low refractive index layer may be made of at least one material selected from the group consisting of oxides, carbides, and nitrides.

In addition, according to an embodiment of the present invention, the high refractive index layer may be made of $Ti_3O_5$, and the low refractive index layer may be made of silicon dioxide ($SiO_2$).

In addition, according to the embodiment of the present invention, the thickness of the first high refractive index layer may be 50 to 400 Å, the thickness of the first low refractive index layer may be 150 to 800 Å, the thickness of the second high refractive index layer may be 175 to 900 Å, the thickness of the second low refractive index layer may be 225 to 1100 Å, the thickness of the organic material layer may be 50 to 400 Å, the thickness of the first zinc compound layer may be 100 to 600 Å, the thickness of the germanium layer may be 150 to 800 Å, the thickness of the second zinc compound layer may be 100 to 600 Å, and the thickness of the chromium oxide layer may be 50 to 400 Å.

Embodiments

Hereinafter, the present invention will be described with reference to the accompanying drawings. As those skilled in the art would realize, the described embodiments may be modified in various different ways, all without departing from the spirit or scope of the present invention. In addition, the drawings and description are to be regarded as illustrative in nature and not restrictive. Like reference numerals designate like elements throughout the specification.

Throughout the specification, unless explicitly described to the contrary, the word "comprise" and variations such as "comprises" or "comprising" will be understood to imply the inclusion of stated elements but not the exclusion of any other elements.

Terms used in the present specification are used only to describe specific embodiments, and are not intended to limit the present invention. Singular expressions used herein include plurals expressions unless they have definitely opposite meanings. In the present specification, it should be understood that term "comprise" indicates that a feature, a number, a step, an operation, a component, a part or the combination thereof described in the specification is present, but does not exclude a possibility of presence or addition of one or more other features, numbers, steps, operations, components, parts or combinations thereof, in advance.

Figure 4:
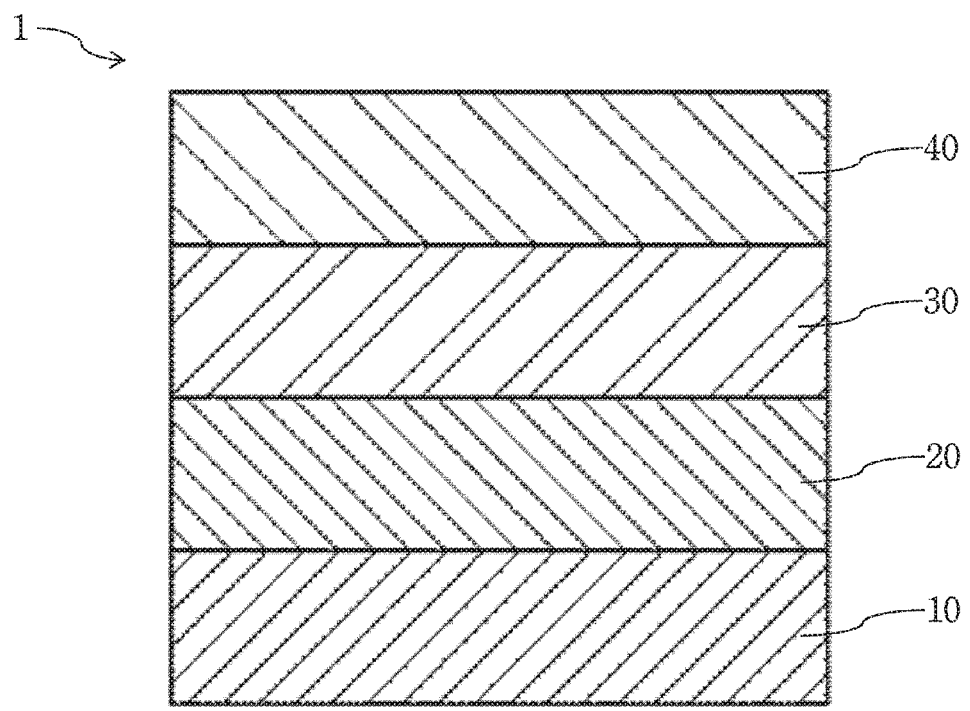
FIG. 4 is a schematic view showing an example of a stacked body of the present invention.

A stacked body 1 of the present invention includes a substrate 10 and a deposition layer 30 formed on the substrate 10. In addition, the stacked body 1 may further include a primer coating layer 20 formed on the upper surface of the substrate 10 and located on the lower surface of the deposition layer 30. Further, the stacked body 1 may further include a black shield coating layer 40 formed on the upper surface of the deposition layer 30. FIG. 4 illustrates a schematic view showing an example of the stacked body 1.

Figure 5:
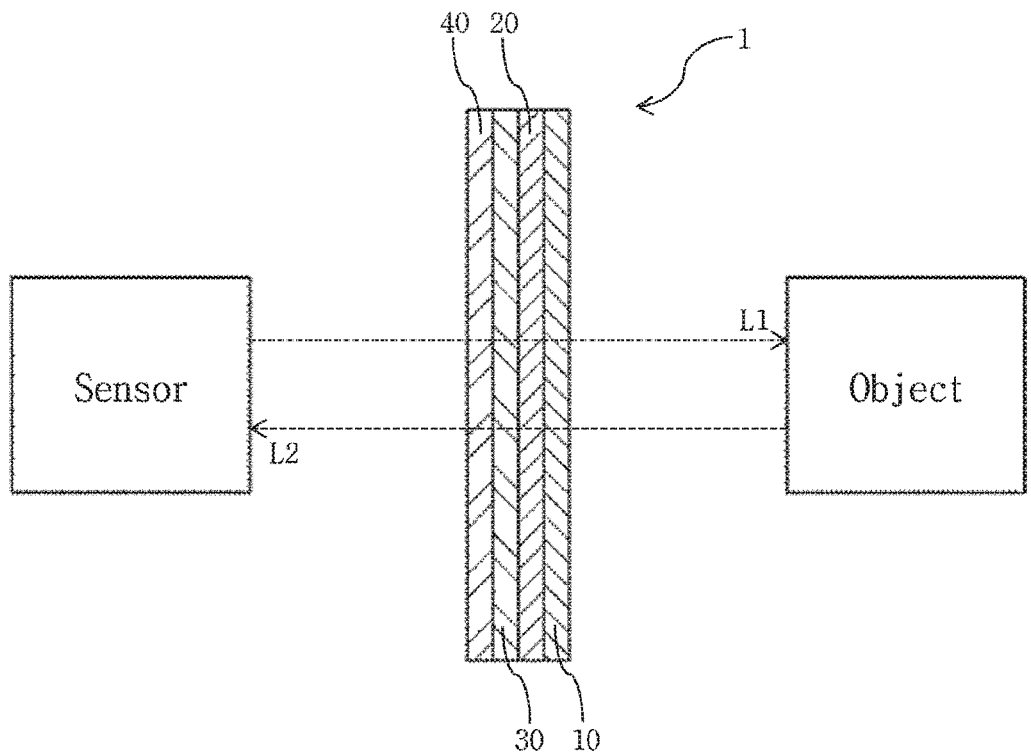
FIG. 5 is a schematic view showing an appearance in which electromagnetic waves are transmitted through the stacked body of the present invention.

The stacked body 1 may transmit electromagnetic waves while exhibiting a specific color and glossiness. Accordingly, the stacked body 1 may be used as a sensor cover for a vehicle. FIG. 5 illustrates a schematic view showing an appearance in which an electromagnetic wave L1 emitted from a sensor reaches an object and an electromagnetic wave L2 reflected from the object reaches the sensor. Hereinafter, the stacked body 1 will be described in detail for each component configuring the stacked body 1.

The substrate 10 may be a transparent substrate 10. The reason is to have a color of light reflected to the deposition layer 30, or the deposition layer 30 and the black shield coating layer 40 be exhibited to the outside of the stacked body 1 as it is. Further, the reason is to have the glossiness represented by the deposition layer 30 be exhibited to the outside of the stacked body 1 as it is. In FIG. 5, when a person views the stacked body 1 from the object side, the stacked body 1 exhibits a specific color. This is because some of the light irradiated from the object side to reach the stacked body 1 is reflected to the object side again to exhibit the specific color. The specific color of the light reflected to the deposition layer 30, or the deposition layer 30 and the black shield coating layer 40 may be exhibited to the outside through the transparent substrate 10 as it is. Particularly, the substrate 10 may be made of at least one material selected from the group consisting of polycarbonate (PC), polymethylmethacrylate (PMMA), polyethylene terephthalate (PET), polyethylene naphthalate (PEN), polyimide (PI), cycloolefin polymer (COP), polyether sulfone (PES), polyetheretherketone (PEEK), polyarylate (PAR), an ABS resin, and a silicone resin, but is not limited thereto.

The primer coating layer 20 may be made of a material mixed with an acrylic resin (a main component), a solvent, and other additives, but is not limited thereto. In addition, the primer coating layer 20 may be formed by painting, dipping, or spraying, but is not limited thereto. Further, the primer coating layer 20 is transparent or translucent. Like the substrate 10, this is to have the color of the light reflected to the deposition layer 30, or the deposition layer 30 and the black shield coating layer 40 be exhibited to the outside of the stacked body 1 as it is. In addition, like the substrate 10, this is to have the glossiness represented by the deposition layer 30 be exhibited to the outside of the stacked body 1 as it is. Further, the primer coating layer 20 has adhesive strength to help the adhesion between the substrate 10 and the deposition layer 30.

The black shield coating layer 40 may be made of a material mixed with an acrylic resin (a main component), a black pigment, a solvent, and other additives, but is not limited thereto. In addition, the black shield coating layer 40 may be formed by painting, dipping, or spraying, but is not limited thereto. In addition, the black shield coating layer 40 is black. The reason is that when the stacked body 1 is used as the sensor cover for vehicles, it is preferable that components in the vehicle are not shown at the outside. In addition, the color of the black shield coating layer 40 is associated with the color of the stacked body 1 exhibited at the outside. The color of the black shield coating layer 40 is exhibited at the outside as it is, and thus, the stacked body 1 may also exhibit black. However, the stacked body 1 may also exhibit a bright color because the materials forming the deposition layer 30, the thickness of the deposition layer 30, and the like are changed.

The deposition layer 30 is formed by depositing one or more layers by a predetermined deposition method. The deposition method may be at least one of thermal evaporation, electron beam evaporation, sputtering, thermal chemical vapor deposition (CVD), plasma enhanced chemical vapor deposition (PECVD), metal organic chemical vapor deposition (MOCVD), and electroless plating, but is not limited thereto.

The deposition layer 30 includes a germanium (Ge) layer 320. The germanium layer 320 is made of germanium or a germanium alloy. The germanium may exhibit glossiness and transmit electromagnetic waves. The germanium alloy may exhibit glossiness and transmit electromagnetic waves. The germanium alloy consists of one or more elements in addition to the germanium. The one or more elements may be elements belonging to Groups 3B to 5A of the periodic table. More specifically, the one or more elements may be elements selected from the group consisting of gold (Au), silver (Ag), boron (B), aluminum (Al), gallium (Ga), indium (In), tin (Sn), and thallium (Tl). In the germanium alloy, the content of the germanium is provided at 50 to 99 wt % and the content of the remaining components is provided at 1 to 50 wt %. If the germanium content is less than 50 wt % or the content of the remaining components is more than 50 wt %, the glossiness and a metallic texture exhibited by the germanium layer 320 may be worse than those to be desired. If the germanium content is more than 99 wt % or the content of the remaining components is less than 1 wt %, target performance (for example, strength) of the germanium layer 320 may not be exhibited properly.

Figure 6:
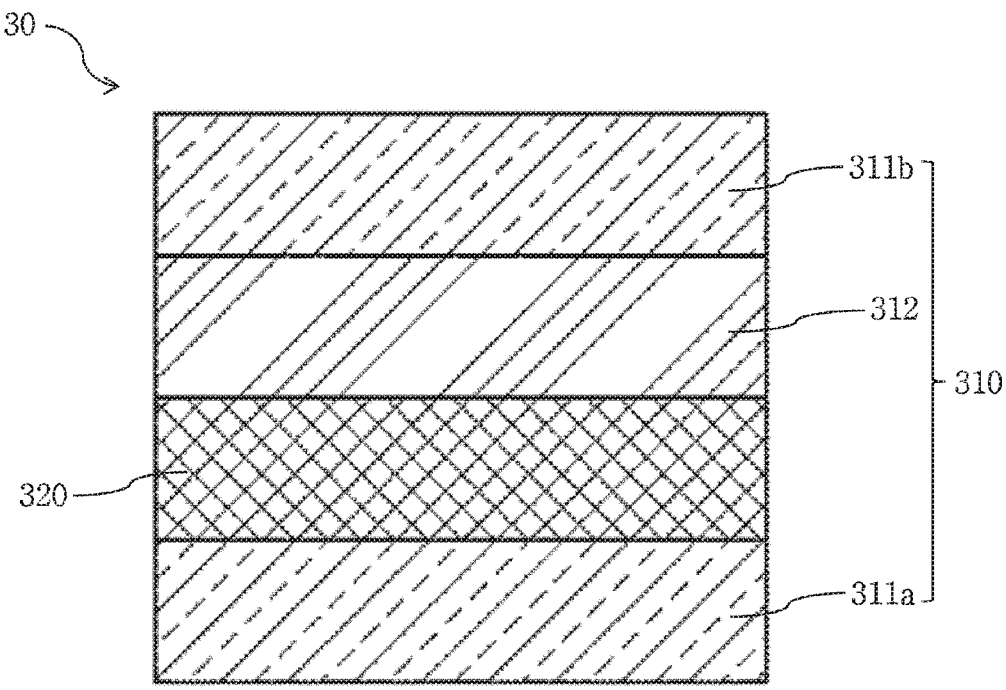
FIG. 6 is a schematic view showing an example of a deposition layer including a germanium layer and a ceramic layer.

The deposition layer 30 may include various layers in addition to the germanium layer 320. For example, the deposition layer 30 may include the germanium layer 320 and a ceramic layer 310 (see FIG. 6). The ceramic layer 310 is made of ceramic. The ceramic layer 310 may have a first function of adjusting the color and brightness of the stacked body 1, a second function of protecting the germanium layer 320 from external impacts, and a third function of enhancing the adhesion between the substrate 10 (or the primer coating layer 20) and the germanium layer 320. In order to exhibit the first function, the ceramic layer 310 may include at least one high refractive index layer 311 and at least one low refractive index layer 312. The high refractive index layer 311 may have a refractive index of 1.7 to 2.6, and may be made of at least one material selected from the group consisting of oxides, carbides, and nitrides. The low refractive index layer 312 may have a refractive index of 1.4 or more and less than 1.7, and may be made of at least one material selected from the group consisting of oxides, carbides, and nitrides. More particularly, the high refracindex layer 311 may be made of titanium dioxide (TiO$_2$), and the low refractive index layer 312 may be made of silicon dioxide (SiO$_2$). The distinguishing criteria between the refractive index of the high refractive index layer 311 and the refractive index of the low refractive index layer 312 is determined to easily control the color and brightness of the stacked body 1. In other words, once the refractive index of the high refractive index layer 311 and the refractive index of the low refractive index layer 312 are determined, the number of layers of the ceramic layer 310, the thickness of the ceramic layer 310, the thickness of the germanium layer 320, and the like are adjusted, and thus, the color and brightness of the stacked body 1 may be adjusted. FIG. 6 illustrates a schematic view showing an example of the deposition layer 30 including the germanium layer 320 and the ceramic layer 310. In FIG. 6, the deposition layer 30 is formed by depositing a first high refractive index layer 311a, the germanium layer 320, the low refractive index layer 312, and a second high refractive index layer 311b in sequence. In FIG. 6, since the germanium layer 320 is located between the first high refractive index layer 311a and the low refractive index layer 312, the first high refractive index layer 311a and the low refractive index layer 312 is considered to exhibit the second function. Further, in FIG. 6, since the adhesion is applied between the first high refractive index layer 311a and the germanium layer 320, the first high refractive index layer 311a is considered to exhibit the third function.

Figure 7:
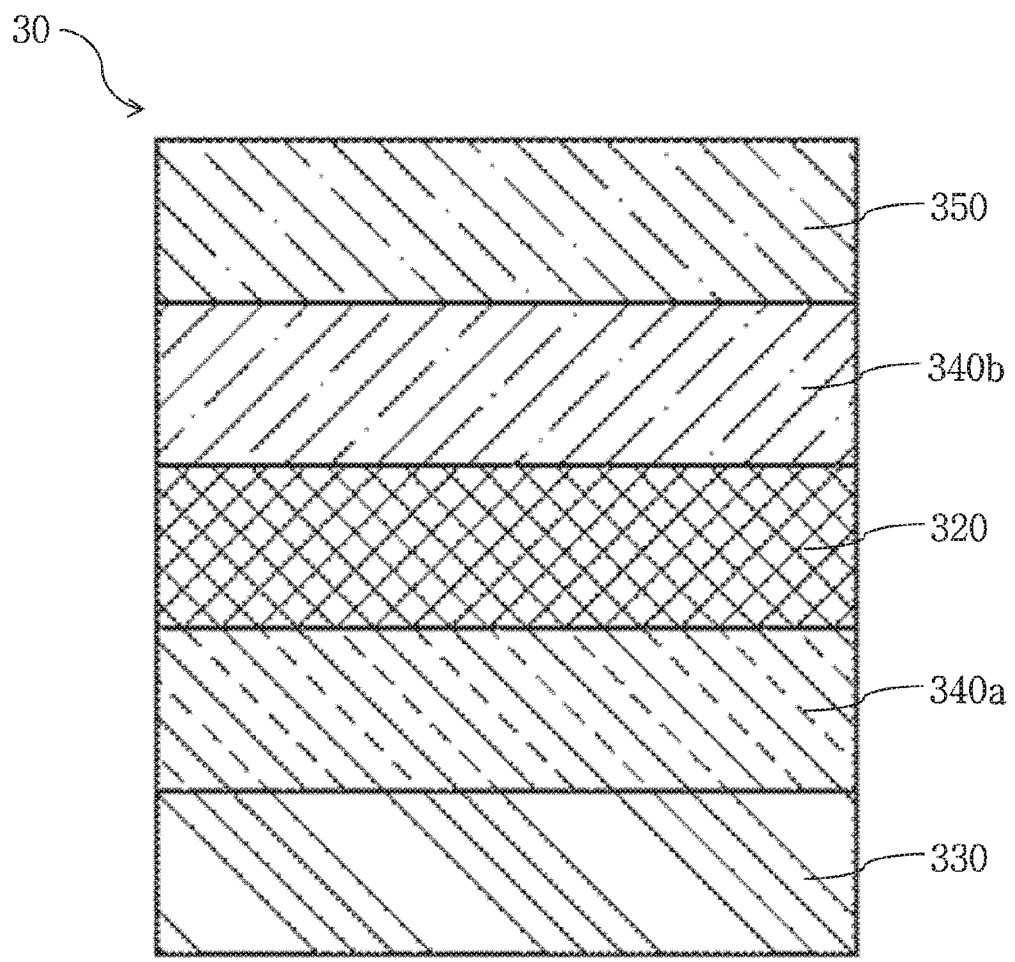
FIG. 7 is a schematic view showing an example of a deposition layer including an organic material layer, a zinc compound layer, a germanium layer and a chromium oxide layer.

As another example, the deposition layer 30 may include an organic material layer 330, a zinc compound layer 340, and the germanium layer 320 (see FIG. 7). The organic material layer 330 is made of an organic material. Particularly, the organic material layer 330 may be made of Glipoxan™. Meanwhile, the germanium layer 320 is easily oxidized when exposed to moisture. This means that water resistance and moisture resistance of the stacked body 1 are not good. However, when the stacked body 1 includes the organic material layer 330, the organic material layer 330 may enhance the water resistance and moisture resistance of the stacked body 1. The zinc compound layer 340 is made of zinc sulfide (ZnS) or Zinc selenide (ZnSe). The zinc compound layer 340 functions to enhance the water resistance and moisture resistance of the stacked body 1. Particularly, when the zinc compound layer 340 is formed of two layers (a first zinc compound layer 340a and a second zinc compound layer 340b) and the germanium layer 320 is located between the two layers, the zinc compound layer 340 may enhance the water resistance and moisture resistance of the stacked body 1 while protecting the germanium layer 320 from external impacts. Further, when the zinc compound layer 340 is formed of two layers, the deposition layer 340 may be formed by depositing the organic material layer 330, the first zinc compound layer 340a, the germanium layer 320, and the second zinc compound layer 340b in sequence.

As yet another example, the deposition layer 30 may include the organic material layer 330, the zinc compound layer 340, the germanium layer 320, and a chromium oxide (CrOx) layer 350 (see FIG. 7). The contents of the organic material layer 330 and the zinc compound layer 340 are as described above. The chromium oxide layer 350 is made of chromium oxide. The chromium oxide layer 350 is deposited on the uppermost layer of the deposition layer 30 to protect the entire deposition layer 30. In particular, the chromium oxide layer 350 may prevent moisture from penetrating into the germanium layer 320. Further, when the stacked body 1 includes the black shield coating layer 40, the adhesion is applied between the chromium oxide layer 350 and the black shield coating layer 40. Therefore, the chromium oxide layer 350 also functions to improve the adhesion between the deposition layer 30 and the black shield coating layer 40. FIG. 7 illustrates a schematic view showing an example of the deposition layer 30 including the organic material layer 330, the zinc compound layer 340, the germanium layer 320, and the chromium oxide layer 350. In FIG. 7, the deposition layer 30 is formed by depositing the organic material layer 330, the first zinc compound layer 340a, the germanium layer 320, the second zinc compound layer 340b, and the chromium oxide layer 350 in sequence. In FIG. 7, the thickness of the organic material layer 330 is preferably 50 to 400 Å. If the thickness of the organic material layer 330 is less than 50 Å, the function of enhancing the water resistance and moisture resistance of the organic material layer 330 may not be exhibited properly. If the thickness of the organic material layer 330 is more than 400 Å, the glossiness and the metallic texture, which are exhibited by the germanium layer 320, may be damaged. Further, in this case, the electromagnetic wave transmittance of the stacked body 1 may also be lowered. In FIG. 7, the thickness of the first zinc compound layer 340a is preferably 100 to 600 Å. If the thickness of the first zinc compound layer 340a is less than 100 Å, the function of enhancing the water resistance and moisture resistance of the first zinc compound layer 340a may not be exhibited properly. Further, in this case, the first zinc compound layer 340a may not properly protect the germanium layer 320 from external impacts. If the thickness of the first zinc compound layer 340a is more than 600 Å, the electromagnetic wave transmittance of the stacked body 1 may be lowered. In FIG. 7, the thickness of the germanium layer 320 is preferably 150 to 800 Å. If the thickness of the germanium layer 320 is less than 150 Å, the germanium layer 320 may be easily peeled due to various environmental factors. If the thickness of the germanium layer 320 is more than 800 Å, the electromagnetic wave transmittance of the stacked body 1 may be lowered. In FIG. 7, the thickness of the second zinc compound layer 340b is preferably 100 to 600 Å. If the thickness of the second zinc compound layer 340b is less than 100 Å, the function of enhancing the water resistance and moisture resistance of the second zinc compound layer 340b may not be exhibited properly. Further, in this case, the second zinc compound layer 340b may not properly protect the germanium layer 320 from external impacts. If the thickness of the second zinc compound layer 340b is more than 600 Å, the electromagnetic wave transmittance of the stacked body 1 may be lowered. In FIG. 7, the thickness of the chromium oxide layer 350 is preferably 50 to 400 Å. If the thickness of the chromium oxide layer 350 is less than 50 Å, the entire deposition layer protective function of the chromium oxide layer 350 may be weak. If the thickness of the chromium oxide layer 350 is more than 400 Å, the electromagnetic wave transmittance of the stacked body 1 may be lowered. The stacked body 1 manufactured by forming the deposition layer 30 (the deposition layer 30 illustrated in FIG. 7), which simultaneously satisfies the aforementioned thickness conditions, on the transparent substrate 10 exhibits black. The black stacked body 1 may be in harmony with a front grille and/or an emblem.

Figure 8:
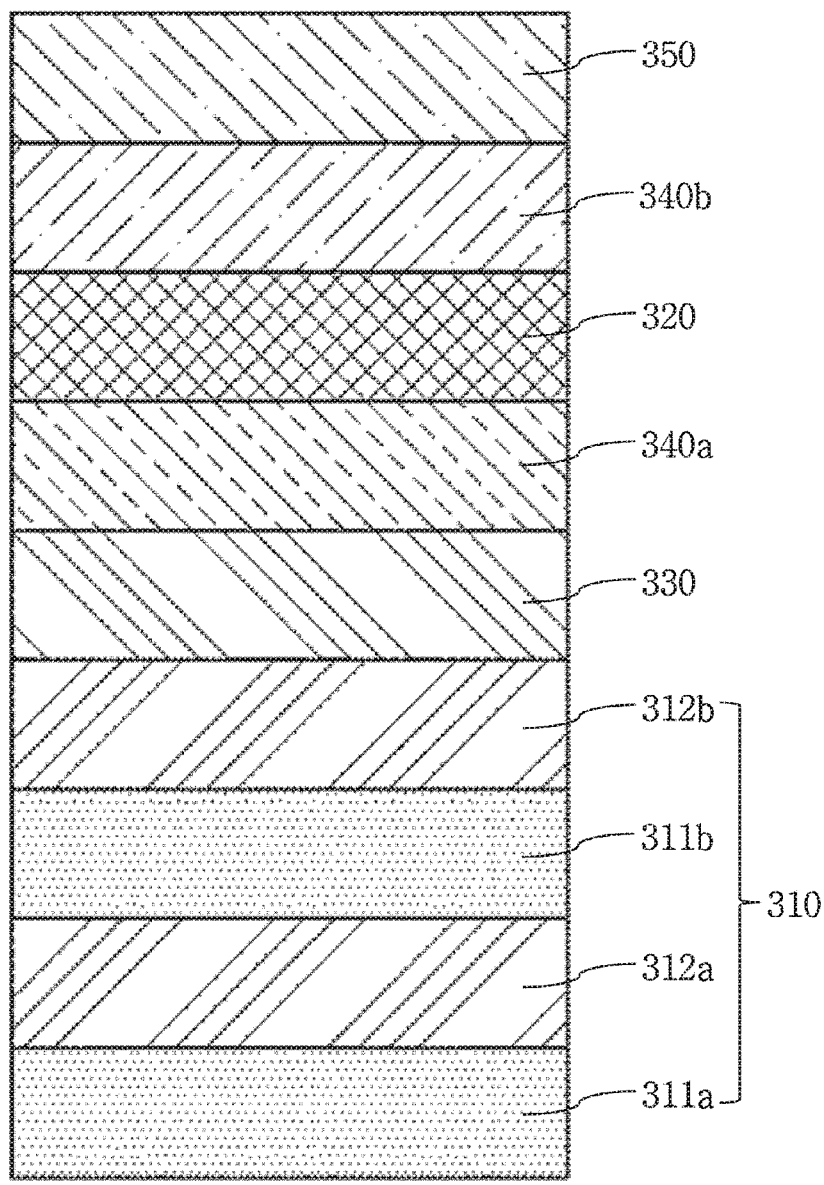
FIG. 8 is a schematic view showing an example of a deposition layer including a ceramic layer, an organic material layer, a zinc compound layer, a germanium layer and a chromium oxide layer.

As still another example, the deposition layer 30 may include the ceramic layer 310, the organic material layer 330, the zinc compound layer 340, the germanium layer 320, and the chromium oxide layer 350 (see FIG. 8). The contents of the organic material layer 330, the zinc compound layer 340, and the chromium oxide layer 350 are as described above. The ceramic layer 310 is made of ceramic. The ceramic layer 310 is deposited on the lowermost layer of the deposition layer 30 to adjust the color and brightness of the stacked body 1. To this end, the ceramic layer 310 may include at least one high refractive index layer 311 and at least one low refractive index layer 312, and the high refractive index layers 311 and the low refractive index layers 312 may be alternately deposited. The high refractive index layer 311 may have a refractive index of 1.7 to 2.6, and may be made of at least one material selected from the group consisting of oxides, carbides, and nitrides. The low refractive index layer 312 may have a refractive index of 1.4 or more and less than 1.7, and may be made of at least one material selected from the group consisting of oxides, carbides, and nitrides. More particularly, the high refractive index layer 311 may be made of $Ti_3O_5$, and the low refractive index layer 312 may be made of silicon dioxide. The distinguishing criteria between the refractive index of the high refractive index layer 311 and the refractive index of the low refractive index layer 312 is determined to easily control the color and brightness of the stacked body 1. In other words, once the refractive index of the high refractive index layer 311 and the refractive index of the low refractive index layer 312 are determined, the number of layers of the ceramic layer 310, the thickness of the ceramic layer 310, the thickness of the germanium layer 320, and the like are adjusted, and thus, the color and brightness of the stacked body 1 may be adjusted. FIG. 8 illustrates a schematic view showing an example of the deposition layer 30 including the ceramic layer 310, the organic material layer 330, the zinc compound layer 340, the germanium layer 320 and the chromium oxide layer 350. In FIG. 8, the deposition layer 30 is formed by depositing the first high refractive index layer 311a, the first low refractive index layer 312a, the second high refractive index layer 311b, the second low refractive index layer 312b, the organic material layer 330, the first zinc compound layer 340a, the germanium layer 320, the second zinc compound layer 340b, and the chromium oxide layer 350 in sequence. In FIG. 8, the contents with regards to the thickness of the organic material layer 330, the thickness of the first zinc compound layer 340a, the thickness of the germanium layer 320, the thickness of the second zinc compound layer 340b, and the thickness of the chromium oxide layer 350 are as described above. In FIG. 8, it is preferred that the thickness of the first high refractive index layer 311a is 50 to 400 Å, the thickness of the first low refractive index layer 312a is 150 to 800 Å, the thickness of the second high refractive index layer 311b is 175 to 900 Å, and the thickness of the second low refractive index layer 312b is 225 to 1100 Å. The stacked body 1 manufactured by forming the deposition layer 30 (the deposition layer 30 illustrated in FIG. 8), which simultaneously satisfies the aforementioned thickness conditions, on the transparent substrate 10 exhibits silver color. That is, as illustrated in FIG. 8, the ceramic layer 310 is added to the deposition layer 30 illustrated in FIG. 7, and thus, the color of the stacked body 1 is changed from black to silver. The silver stacked body 1 may be in harmony with the front grille and/or the emblem.

EXAMPLES

Example 1—Manufacture of Black Stacked Body 1

An injection-molded polycarbonate substrate 10 was prepared. A primer coating layer 20 was formed by coating the upper surface of the substrate 10 with a slurry containing an acrylic resin as a main component.

The substrate 10 formed with the primer coating layer 20 was mounted on the bottom in a vacuum chamber and exhausted so that the degree of vacuum in the vacuum chamber was $7\times10^6$ Torr. Glipoxan™ in a monomer state was supplied into the vacuum chamber at 120 sccm through a mass flow controller (MFC) installed in the vacuum chamber. In addition, power of 3000 W was applied to an electrode plate of a plasma generator installed in the vacuum chamber. As a result, the Glipoxan™ in a polymer state was deposited on the upper surface of the primer coating layer 20, thereby depositing an organic material layer 330. This is because plasma polymerization mainly occurred, in which the Glipoxan™ in the monomer state was changed to the plasma state in an electric field by the plasma generator in the vacuum chamber, and then the materials in the plasma state were polymerized to be changed into the Glipoxan™ in the polymer state.

The substrate 10 formed with the primer coating layer 20 and the organic material layer 330 was mounted on the upper portion in the vacuum chamber and a zinc sulfide chemical was injected into a crucible provided in the vacuum chamber. The vacuum chamber was exhausted so that the degree of vacuum in the vacuum chamber was $1\times10^{-5}$ Torr. In addition, a voltage of 7.5 kV (a current of 50 to 450 mA) was supplied to an electron beam gun provided in the vacuum chamber to irradiate an electron beam to the zinc sulfide chemical. As a result, zinc sulfide was deposited on the upper surface of the organic material layer 330, thereby depositing the first zinc compound layer 340a. This is because the zinc sulfide is evaporated by the energy of the electron beam such that the zinc sulfide is deposited on the upper surface of the organic material layer 330. By such an electron beam evaporation method, the germanium layer 320, the second zinc compound layer 340b, and the chromium oxide layer 350 were sequentially deposited on the upper surface of the first zinc compound layer 340a. Germanium was used for the germanium layer 320. Zinc sulfide was used for the second zinc compound layer 340b. In addition, $Cr_2O_3$ was used for the chromium oxide layer 350.

The stacked body 1 deposited up to the chromium oxide layer 350 was extracted from the vacuum chamber and then coated with a slurry containing an acrylic resin as a main component and added with a black pigment to form a black shield coating layer 40.

As a result, the stacked body 1 formed by the substrate 10, the primer coating layer 20, the organic material layer 330, the first zinc compound layer 340a, the germanium layer 320, the second zinc compound layer 340b, the chromium oxide layer 350, and the black shield coating layer 40 was manufactured (see FIGS. 4 and 7). The thickness of the organic material layer 330 was 150 Å. The thickness of the first zinc compound layer 340a was 250 Å. The thickness of the germanium layer 320 was 350 Å. The thickness of the second zinc compound layer 340a was 250 Å. In addition, the thickness of the chromium oxide layer was 150 Å.

Example 2—Manufacture of Silver Stacked Body 1 by Adding Ceramic Layer 310 to the Stacked Body 1 in Example 1

An injection-molded polycarbonate substrate 10 was prepared. A primer coating layer 20 was formed by coating the upper surface of the substrate 10 with a slurry containing an acrylic resin as a main component.

The substrate 10 formed with the primer coating layer 20 was mounted on the upper portion in the vacuum chamber and a $Ti_3O_5$ chemical was injected into a crucible provided in the vacuum chamber. The vacuum chamber was exhausted so that the degree of vacuum in the vacuum chamber was $1 \times 10^{-5}$ Torr. In addition, a voltage of 7.5 kV (a current of 50 to 450 mA) was supplied to an electron beam gun provided in the vacuum chamber to irradiate an electron beam to the $Ti_3O_5$ chemical. As a result, $Ti_3O_5$ was deposited on the upper surface of the primer coating layer 20, thereby depositing the first high refractive index layer 311a. The reason is that the $Ti_3O_5$ is evaporated by the energy of the electron beam and the $Ti_3O_5$ is deposited on the upper surface of the primer coating layer 20. By such an electron beam evaporation method, the first low refractive index layer 312a, the second high refractive index layer 311b, and the second low refractive index layer 312b were sequentially deposited on the upper surface of the first high refractive index layer 311a. Silicon dioxide was used for the first low refractive index layer 312a and the second low refractive index layer 312b. In addition, the $Ti_3O_5$ was used for the second high refractive index layer 311b.

The substrate 10 formed with the primer coating layer 20 and the ceramic layer 310 was mounted on the bottom in a vacuum chamber, and the vacuum chamber was exhausted so that the degree of vacuum in the vacuum chamber was $7 \times 10^6$ Torr. Glipoxan™ in a monomer state was supplied into the vacuum chamber at 120 sccm through an MFC installed in the vacuum chamber. In addition, power of 3000 W was applied to an electrode plate of a plasma generator installed in the vacuum chamber. As a result, the Glipoxan™ in a polymer state was deposited on the upper surface of the second low refractive index layer 312b, thereby depositing the organic material layer 330. This is because plasma polymerization mainly occurred inside the vacuum chamber.

Thereafter, the same layers as the layers in Example 1 were formed by the same method as the method in Example 1. As a result, the stacked body 1 formed by the substrate 10, the primer coating layer 20, the first high refractive index layer 311a, the first low refractive index layer 312a, the second high refractive index layer 311b, the second low refractive index layer 312b, the organic material layer 330, the first zinc compound layer 340a, the germanium layer 320, the second zinc compound layer 340b, the chromium oxide layer 350 and the black shield coating layer 40 was manufactured (see FIGS. 4 and 8). The thickness of the first high refractive index layer 311a was 150 Å. The thickness of the first low refractive index layer 312a was 350 Å. The thickness of the second high refractive index layer 311b was 400 Å. The thickness of the second low refractive index layer 312b was 500 Å. In addition, the thicknesses of the remaining layers were the same as the thicknesses of the layers in Example 1 corresponding thereto.

Comparative Example 1—Excluding the Organic Material Layer 330, the Zinc Compound Layer 340, and the Chromium Oxide Layer 350 from the Stacked Body 1 in Example 1

An injection-molded polycarbonate substrate 10 was prepared. A primer coating layer 20 was formed by coating the upper surface of the substrate 10 with a slurry containing an acrylic resin as a main component.

The substrate 10 formed with the primer coating layer 20 was mounted on the upper portion in the vacuum chamber and a germanium specimen was injected into a crucible provided in the vacuum chamber. The vacuum chamber was exhausted to that the degree of vacuum in the vacuum chamber was $1 \times 10^{-5}$ Torr. In addition, a voltage of 7.5 kV (a current of 50 to 450 mA) was supplied to an electron beam gun provided in the vacuum chamber to irradiate an electron beam to the germanium specimen. As a result, germanium was deposited on the upper surface of the primer coating layer 20, thereby depositing the germanium layer 320. The reason is that the germanium was evaporated by the energy of the electron beam and the germanium was deposited on the upper surface of the primer coating layer 20.

The stacked body 1 deposited up to the germanium layer 320 was extracted from the vacuum chamber and then coated with a slurry containing an acrylic resin as a main component and added with a black pigment to form a black shield coating layer 40.

As a result, the stacked body 1 formed by the substrate 10, the primer coating layer 20, the germanium layer 320, and the black shield coating layer 40 was manufactured. The thickness of the germanium layer 320 was 350 Å.

Comparative Example 2—Excluding the Organic Material Layer 330 and the Chromium Oxide Layer 350 from the Stacked Body 1 in Example 1

An injection-molded polycarbonate substrate 10 was prepared. A primer coating layer 20 was formed by coating the upper surface of the substrate 10 with a slurry containing an acrylic resin as a main component.

The substrate 10 formed with the primer coating layer 20 was mounted on the upper portion in the vacuum chamber and a zinc sulfide chemical was injected into a crucible provided in the vacuum chamber. The vacuum chamber was exhausted so that the degree of vacuum in the vacuum chamber was $1 \times 10^{-5}$ Torr. In addition, a voltage of 7.5 kV (a current of 50 to 450 mA) was supplied to an electron beam gun provided in the vacuum chamber to irradiate an electron beam to the zinc sulfide chemical. As a result, zinc sulfide was deposited on the upper surface of the primer coating layer 20, thereby depositing the first zinc compound layer 340a. By such an electron beam evaporation method, the germanium layer 320 and the second zinc compound layer 340b were sequentially deposited on the upper surface of the first zinc compound layer 340a. Germanium was used for the germanium layer 320. In addition, zinc sulfide was used for the second zinc compound layer 340b.

The stacked body 1 deposited up to the second zinc compound layer 340b was extracted from the vacuum chamber and then coated with a slurry containing an acrylic resin as a main component and added with a black pigment to form the black shield coating layer 40.

As a result, the stacked body 1 formed by the substrate 10, the primer coating layer 20, the first zinc compound layer 340a, the germanium layer 320, the second zinc compound layer 340b, and the black shield coating layer 40 was manufactured. The thickness of the first zinc compound layer 340a was 250 Å. The thickness of the germanium layer 320 was 350 Å. In addition, the thickness of the second zinc compound layer 340a was 250 Å.

Comparative Example 3—Excluding the Chromium Oxide Layer 350 from the Stacked Body 1 in Example 1

An injection-molded polycarbonate substrate 10 was prepared. A primer coating layer 20 was formed by coating the upper surface of the substrate 10 with a slurry containing an acrylic resin as a main component.

The substrate 10 formed with the primer coating layer 20 was mounted on the bottom in a vacuum chamber, and the vacuum chamber was exhausted so that the degree of vacuum in the vacuum chamber was $7\times10^{-6}$ Torr. Glipoxan™ in a monomer state was supplied into the vacuum chamber at 120 sccm through an MFC installed in the vacuum chamber. In addition, power of 3000 W was applied to an electrode plate of a plasma generator installed in the vacuum chamber. As a result, the Glipoxan™ in a polymer state was deposited on the upper surface of the primer coating layer 20, thereby depositing the organic material layer 330. This is because plasma polymerization mainly occurred inside the vacuum chamber.

The substrate 10 formed with the primer coating layer 20 and the organic material layer 330 was mounted at the upper portion in the vacuum chamber and a zinc sulfide chemical was injected into a crucible provided in the vacuum chamber. The vacuum chamber was exhausted so that the degree of vacuum in the vacuum chamber was $1\times10^{-5}$ Torr. In addition, a voltage of 7.5 kV (a current of 50 to 450 mA) was supplied to an electron beam gun provided in the vacuum chamber to irradiate an electron beam to the zinc sulfide chemical. As a result, zinc sulfide was deposited on the upper surface of the organic material layer 330, thereby depositing the first zinc compound layer 340a. This is because the zinc sulfide was evaporated by the energy of the electron beam such that the zinc sulfide was deposited on the upper surface of the organic material layer 330. By such an electron beam evaporation method, the germanium layer 320 and the second zinc compound layer 340b were sequentially deposited on the upper surface of the first zinc compound layer 340a. Germanium was used for the germanium layer 320. In addition, the zinc sulfide was used for the second zinc compound layer 340b.

The stacked body 1 deposited up to the second zinc compound layer 340b was extracted from the vacuum chamber and then coated with a slurry containing an acrylic resin as a main component and added with a black pigment to form the black shield coating layer 40.

As a result, the stacked body 1 formed by the substrate 10, the primer coating layer 20, the organic material layer 330, the first zinc compound layer 340a, the germanium layer 320, the second zinc compound layer 340b, and the black shield coating layer 40 was manufactured. The thickness of the organic material layer 330 was 150 Å. The thickness of the first zinc compound layer 340a was 250 Å. The thickness of the germanium layer 320 was 350 Å. In addition, the thickness of the second zinc compound layer 340a was 250 Å.

Comparative Example 4—Excluding the Organic Material Layer 330, the Zinc Compound Layer 340, and the Chromium Oxide Layer 350 from the Stacked Body 1 in Example 2

The stacked body 1 formed by the substrate 10, the primer coating layer 20, the first high refractive index layer 311a, the first low refractive index layer 312a, the second high refractive index layer 311b, and the second low refractive index layer 312b was manufactured. In the stacked body 1, the same materials as the materials in Example 2 and the same method as the method in Example 2 were used.

The substrate 10 formed with the primer coating layer 20 and the ceramic layer 310 was mounted on the upper portion in the vacuum chamber and a germanium specimen was injected into a crucible provided in the vacuum chamber. The vacuum chamber was exhausted so that the degree of vacuum in the vacuum chamber was $1\times10^{-5}$ Torr. In addition, a voltage of 7.5 kV (a current of 50 to 450 mA) was supplied to an electron beam gun provided in the vacuum chamber to irradiate an electron beam to the germanium specimen. As a result, germanium was deposited on the upper surface of the second low refractive index layer 312b, thereby depositing the germanium layer 320. The reason is that the germanium was evaporated by the energy of the electron beam and the germanium was deposited on the upper surface of the second low refractive index layer 312b.

The stacked body 1 deposited up to the germanium layer 320 was extracted from the vacuum chamber and then coated with a slurry containing an acrylic resin as a main component and added with a black pigment to form the black shield coating layer 40.

As a result, the stacked body 1 formed by the substrate 10, the primer coating layer 20, the first high refractive index layer 311a, the first low refractive index layer 312a, the second high refractive index layer 311b, the second low refractive index layer 312b, the germanium layer 320, and the black shield coating layer 40 was manufactured. The thickness of the germanium layer 320 was 350 Å.

Comparative Example 5—Excluding the Organic Material Layer 330 and the Chromium Oxide Layer 350 from the Stacked Body 1 in Example 2

The stacked body 1 formed by the substrate 10, the primer coating layer 20, the first high refractive index layer 311a, the first low refractive index layer 312a, the second high refractive index layer 311b, and the second low refractive index layer 312b was manufactured. In the stacked body 1, the same materials as the materials in Example 2 and the same method as the method in Example 2 were used.

The substrate 10 formed with the primer coating layer 20 and the ceramic layer 310 was mounted on the upper portion in the vacuum chamber and a zinc sulfide chemical was injected into a crucible provided in the vacuum chamber. The vacuum chamber was exhausted so 못 솓 degree of vacuum in the vacuum chamber was $1\times10^{-5}$ Torr. In addition, a voltage of 7.5 kV (a current of 50 to 450 mA) was supplied to an electron beam gun provided in the vacuum chamber to irradiate an electron beam to the zinc sulfide chemical. As a result, zinc sulfide was deposited on the upper surface of the second low refractive index layer 312b, thereby depositing the first zinc compound layer 340a. By such an electron beam evaporation method, the germanium layer 320 and the second zinc compound layer 340b were sequentially deposited on the upper surface of the first zinc compound layer 340a. Germanium was used for the germanium layer 320. In addition, the zinc sulfide was used for the second zinc compound layer 340b.

The stacked body 1 deposited up to the second zinc compound layer 340b was extracted from the vacuum chamber and then coated with a slurry containing an acrylic resin as a main component and added with a black pigment to form the black shield coating layer 40.

As a result, the stacked body 1 formed by the substrate 10, the primer coating layer 20, the first high refractive index layer 311a, the first low refractive index layer 312a, the second high refractive index layer 311b, the second low refractive index layer 312b, the first zinc compound layer 340a, the germanium layer 320, the second zinc compound layer 340b, and the black shield coating layer 40 was manufactured. The thickness of the first zinc compound layer 340a was 250 Å. The thickness of the germanium layer 320 was 350 Å. In addition, the thickness of the second zinc compound layer 340a was 250 Å.

Comparative Example 6—Excluding the Chromium Oxide Layer 350 from the Stacked Body 1 in Example 2

The stacked body 1 formed by the substrate 10, the primer coating layer 20, the first high refractive index layer 311a, the first low refractive index layer 312a, the second high refractive index layer 311b, and the second low refractive index layer 312b was manufactured. In the stacked body 1, the same materials as the materials in Example 2 and the same method as the method in Example 2 were used.

The substrate 10 formed with the primer coating layer 20 and the ceramic layer 310 was mounted on the bottom in the vacuum chamber, and the vacuum chamber was exhausted so that the degree of vacuum in the vacuum chamber was $7 \times 10^6$ Torr. Glipoxan™ in a monomer state was supplied into the vacuum chamber at 120 sccm through an MFC installed in the vacuum chamber. In addition, power of 3000 W was applied to an electrode plate of a plasma generator installed in the vacuum chamber. As a result, the Glipoxan™ in a polymer state was deposited on the upper surface of the second low refractive index layer 312b, thereby depositing the organic material layer 330. This is because plasma polymerization mainly occurred inside the vacuum chamber.

The substrate 10 formed with the primer coating layer 20, the ceramic layer 310, and the organic material layer 330 was mounted on the upper portion in the vacuum chamber and a zinc sulfide chemical was injected into a crucible provided in the vacuum chamber. The vacuum chamber was exhausted so that the degree of vacuum in the vacuum chamber was $1 \times 10^{-5}$ Torr. In addition, a voltage of 7.5 kV (a current of 50 to 450 mA) was supplied to an electron beam gun provided in the vacuum chamber to irradiate an electron beam to the zinc sulfide chemical. As a result, zinc sulfide was deposited on the upper surface of the organic material layer 330, thereby depositing the first zinc compound layer 340a. This is because the zinc sulfide was evaporated by the energy of the electron beam such that the zinc sulfide was deposited on the upper surface of the organic material layer 330. By such an electron beam evaporation method, the germanium layer 320 and the second zinc compound layer 340b were sequentially deposited on the upper surface of the first zinc compound layer 340a. Germanium was used for the germanium layer 320. In addition, the zinc sulfide was used for the second zinc compound layer 340b.

The stacked body 1 deposited up to the second zinc compound layer 340b was extracted from the vacuum chamber and then coated with a slurry containing an acrylic resin as a main component and added with a black pigment to form the black shield coating layer 40.

As a result, the stacked body 1 formed by the substrate 10, the primer coating layer 20, the first high refractive index layer 311a, the first low refractive index layer 312a, the second high refractive index layer 311b, the second low refractive index layer 312b, the organic material layer 330, the first zinc compound layer 340a, the germanium layer 320, the second zinc compound layer 340b, and the black shield coating layer 40 was manufactured. The thickness of the organic material layer 330 was 150 Å. The thickness of the first zinc compound layer 340a was 250 Å. The thickness of the germanium layer 320 was 350 Å. In addition, the thickness of the second zinc compound layer 340a was 250 Å.

Test Example 1—Measurement of Reflectance

Figure 9:
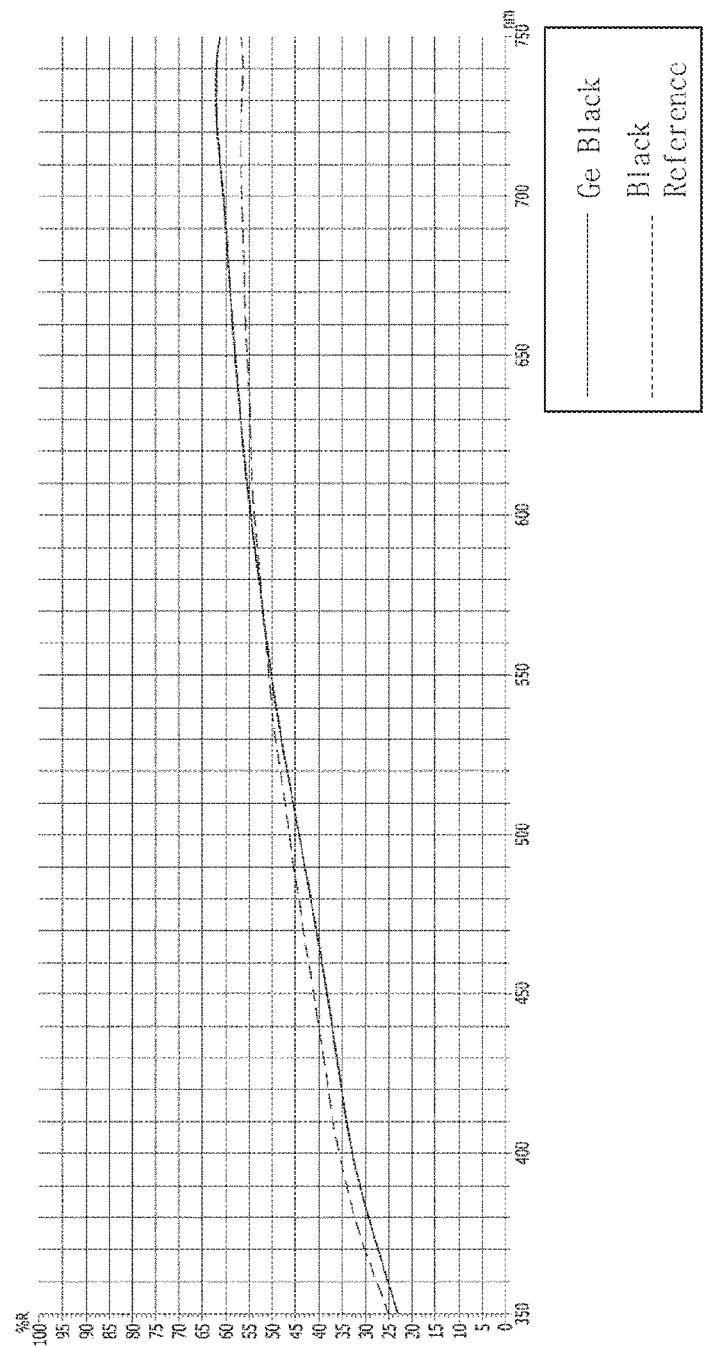
FIG. 9 is a graph showing a result of measuring a reflectance for a stacked body manufactured in Example 1.

With respect to the stacked bodies 1 manufactured in Examples 1 and 2, reflectances were measured (Hitachi spectrophotometer U-3010). A result of measuring the reflectance for the stacked body 1 manufactured in Example 1 is illustrated in FIG. 9. In addition, a result of measuring the reflectance for the stacked body 1 manufactured in Example 2 is illustrated in FIG. 10.

In FIG. 9, since a reflectance graph (Ge Black) of the stacked body 1 is similar to a black reference graph, it can be seen that the stacked body 1 manufactured in Example 1 is black. Further, in FIG. 9, in the reflectance graph of the stacked body 1, the reflectance of the stacked body 1 is higher than the reflectance of a stacked body 1 using indium (In) or tin (Sn) other than germanium in the related art. This means that the stacked body 1 manufactured in Example 1 has glossiness to exhibit an excellent metallic texture.

Figure 10:
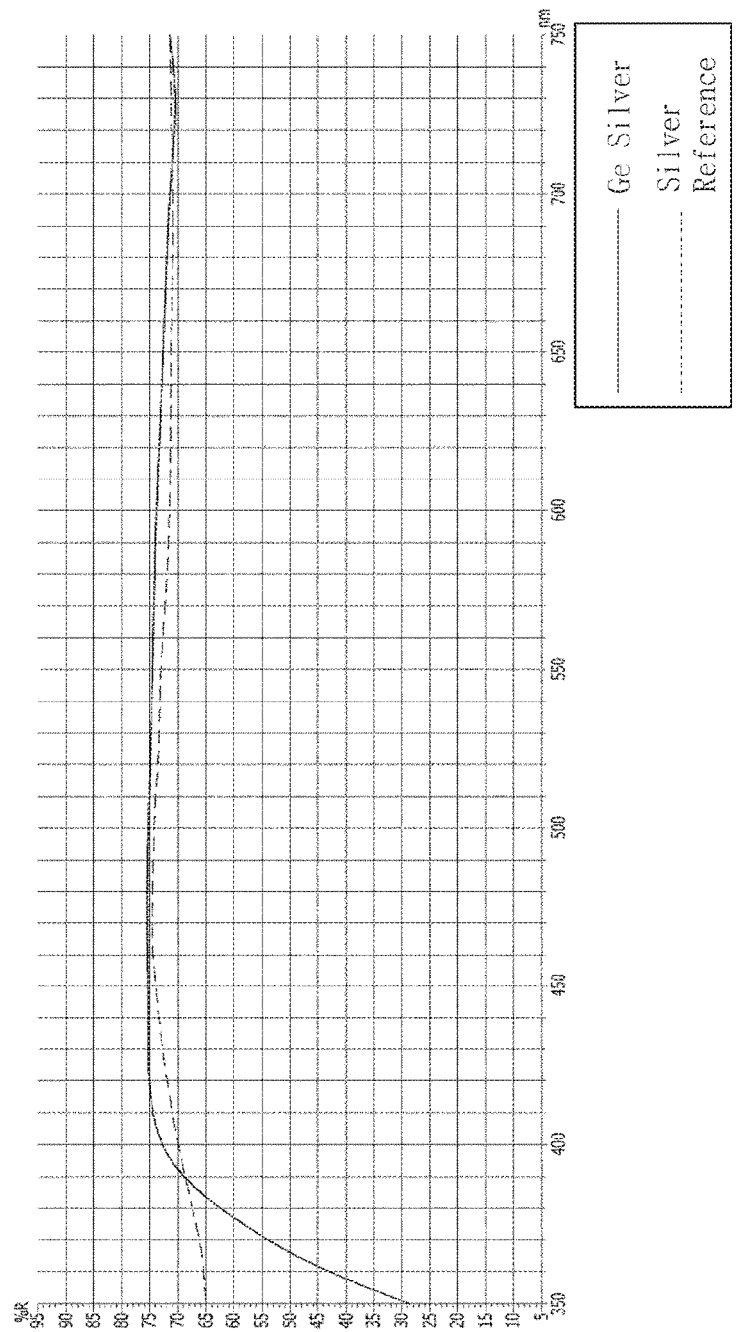
FIG. 10 is a graph showing a result of measuring a reflectance for a stacked body manufactured in Example 2.

In FIG. 10, since a reflectance graph (Ge Silver) of the stacked body 1 is similar to a silver reference graph, it can be seen that the stacked body 1 manufactured in Example 2 is silver. Further, in FIG. 10, in the reflectance graph of the stacked body 1, the reflectance of the stacked body 1 is higher than the reflectance of a stacked body 1 using indium (In) or tin (Sn) other than germanium in the related art. This means that the stacked body 1 manufactured in Example 2 has glossiness to exhibit an excellent metallic texture.

That is, it was confirmed that the stacked body 1 manufactured in Example 1 exhibited black and glossiness, and the stacked body 1 manufactured in Example 2 exhibited silver and glossiness. Of course, the result was also visually confirmed.

Test Example 2—Measurement of Electromagnetic Wave Attenuation Rate

With respect to the stacked bodies 1 manufactured in Examples 1 and 2, attenuation rates were measured (SM5899). The result is illustrated in Table 1 below.

TABLE 1

| | | Measurement result | | | |
|---|---|---|---|---|---|
| Classification | Frequency domain | Attenuation rate | Angle (left/right) | Angle (up/down) | Result |
| Example 1 | 76.5 GHz | −0.62 dB | 0.2° | −0.04° | Satisfactory |
| Example 2 | | −0.66 dB | 0.2° | −0.04° | Satisfactory |

As illustrated in Table 1, an electromagnetic wave transmitted through the stacked body 1 manufactured in Example 1 was changed by −0.62 dB and an electromagnetic wave transmitted through the stacked body 1 manufactured in Example 2 was changed by −0.66 dB. That is, it was confirmed that both electromagnetic waves transmitted through stacked body 1 manufactured in Example 1 and the electromagnetic wave transmitted through stacked body 1 manufactured in Example 2 were attenuated to less than 10%, confirming that the electromagnetic wave transmittances of the stacked bodies 1 manufactured in Examples 1 and 2 were satisfactory levels.

Test Example 3—Water Resistance Test

With respect to the stacked bodies 1 manufactured in Examples 1 and 2 and Comparative Examples 1 to 6, a water resistance test was performed. The stacked bodies 1 were immersed in water at 40° C. for 240 hours and then removed from the water. Air was sprayed to the stacked bodies 1 to remove the moisture and then the stacked bodies 1 were left at room temperature for 1 hour. Thereafter, the stacked bodies 1 were visually confirmed and the results are shown in Table 2 below.

TABLE 2

| Classification | Whether oxidation occur |
| --- | --- |
| Example 1 | No oxidation occurred |
| Example 2 | No oxidation occurred |
| Comparative Example 1 | Oxidation occurred |
| Comparative Example 2 | Oxidation occurred |
| Comparative Example 3 | Oxidation occurred |
| Comparative Example 4 | Oxidation occurred |
| Comparative Example 5 | Oxidation occurred |
| Comparative Example 6 | Oxidation occurred |

As shown in Table 2, except for Examples 1 and 2, oxidation occurred in all other cases. This means that all of the organic material layer 330, the zinc compound layer 340, and the chromium oxide layer 350 are required for the excellent water resistance of the stacked body 1.

Figure 11:
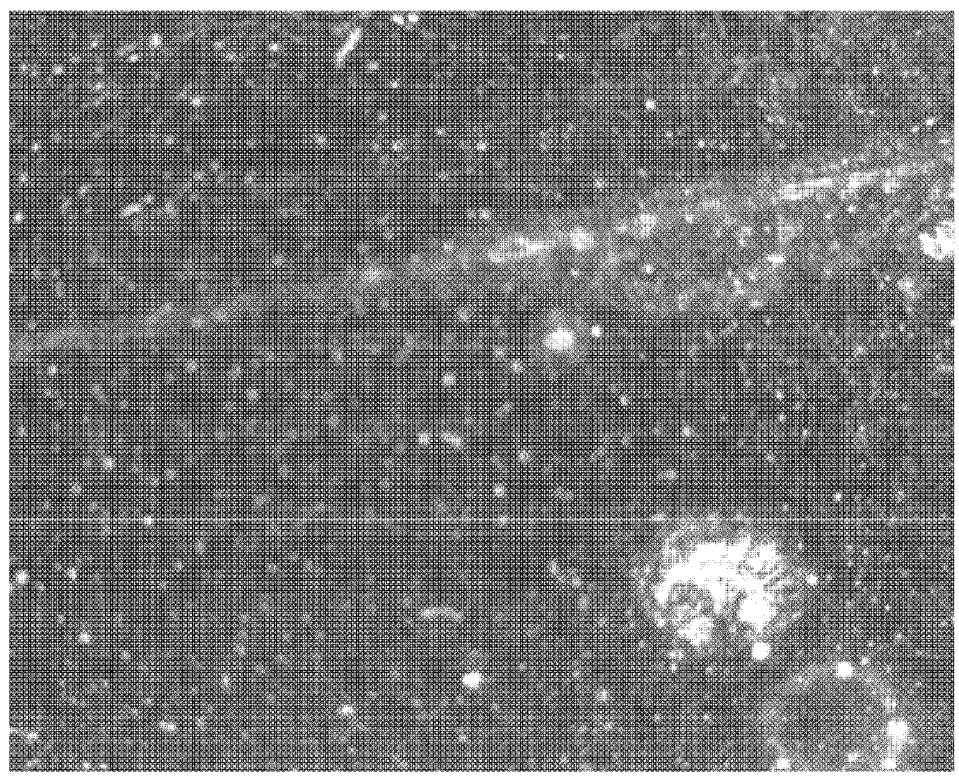
FIG. 11 is a result image of a water resistance test for a stacked body manufactured in Comparative Example 2.
Figure 12:
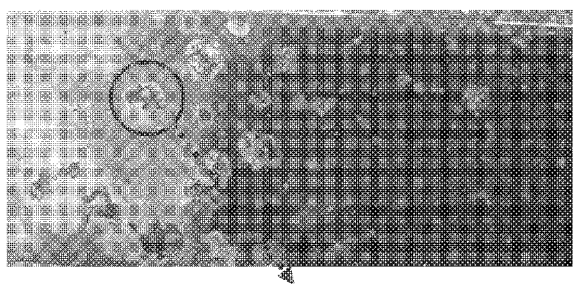
FIG. 12 is an image of a water resistance test result for a stacked body manufactured in Comparative Example 1.
Figure 12:
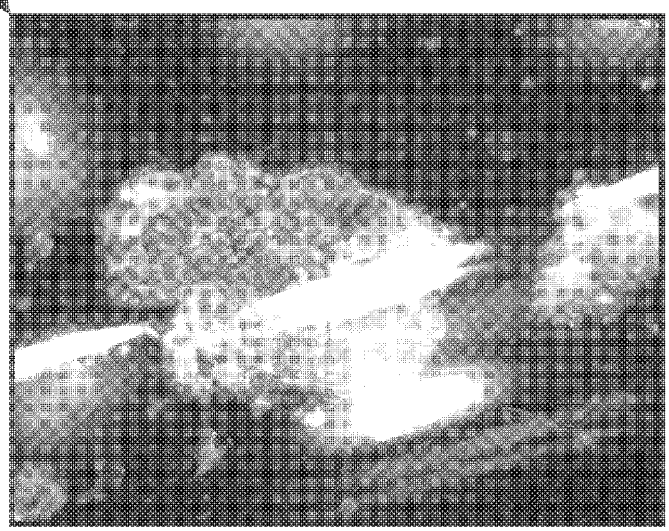

The oxidation of the stacked body 1 manufactured in Comparative Example 2 occurred more intensely than the oxidation of the stacked body 1 manufactured in Comparative Example 3. The oxidation of the stacked body 1 manufactured in Comparative Example 1 occurred more intensely than the oxidation of the stacked body 1 manufactured in Comparative Example 2. For reference, an image of the result of the water resistance test of the stacked body 1 manufactured in Comparative Example 2 is illustrated in FIG. 11, and an image of the result of the water resistance test of the stacked body 1 manufactured in Comparative Example 1 is illustrated in FIG. 12. The oxidation of the stacked body 1 manufactured in Comparative Example 5 occurred more intensely than the oxidation of the stacked body 1 manufactured in Comparative Example 6. In addition, the oxidation of the stacked body 1 manufactured in Comparative Example 4 occurred more intensely than the oxidation of the stacked body 1 manufactured in Comparative Example 5.

Figure 13:
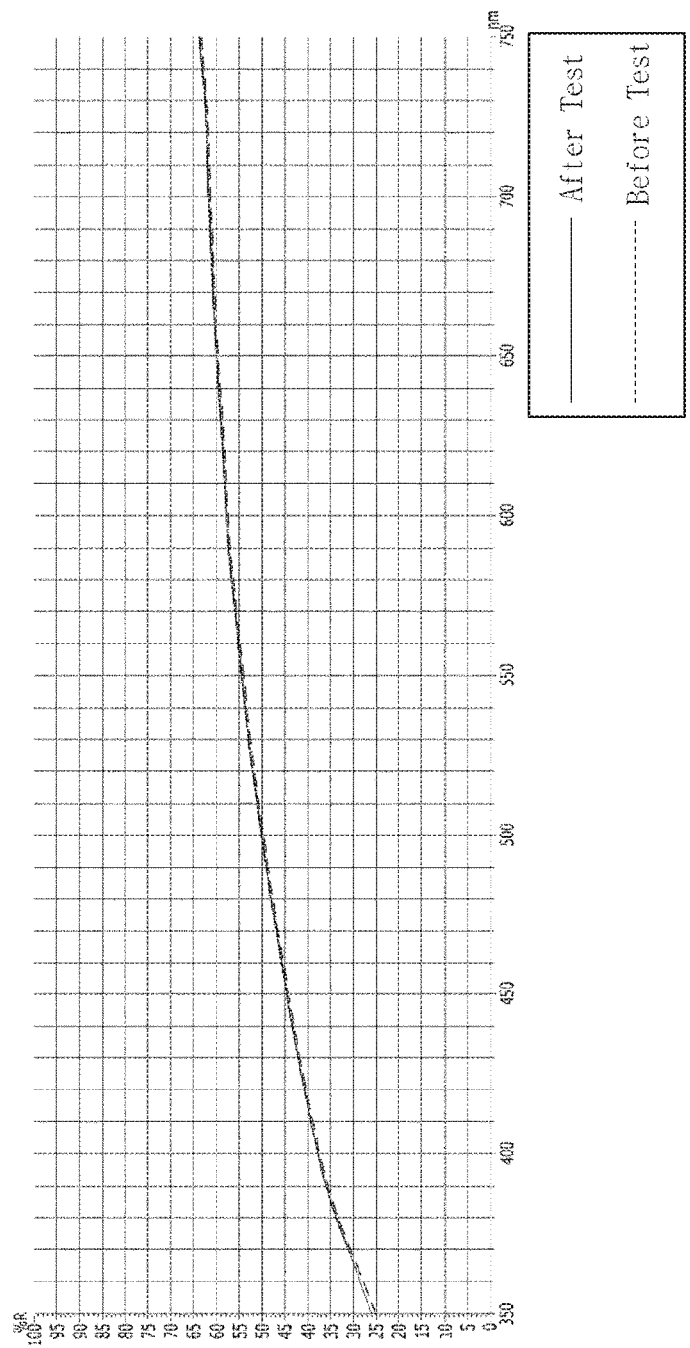
FIG. 13 is a graph showing a result of measuring a reflectance after the water resistance test with respect to the stacked body manufactured in Example 1.
Figure 14:
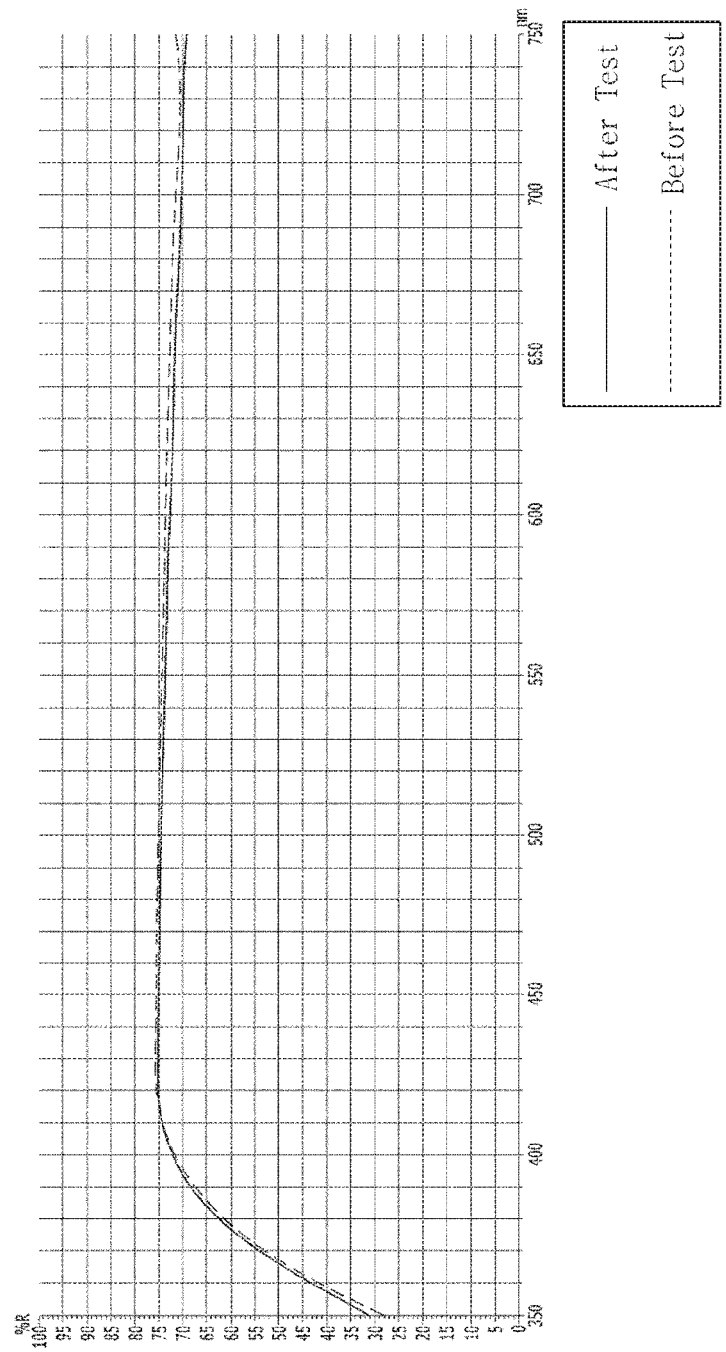
FIG. 14 is a graph showing a result of measuring a reflectance after the water resistance test with respect to the stacked body manufactured in Example 2.

After the water resistance test of the stacked body 1 manufactured in Example 1, a result of measuring a reflectance of this stacked body 1 is illustrated in FIG. 13. In addition, after the water resistance test of the stacked body 1 manufactured in Example 2, a result of measuring a reflectance of this stacked body 1 is illustrated in FIG. 14. As illustrated in FIG. 13, a reflectance graph (After Test) after the water resistance test of the stacked body 1 manufactured in Example 1 is almost the same as a reflectance graph (Before Test) before the water resistance test. In addition, as illustrated in FIG. 14, a reflectance graph (After Test) after the water resistance test of the stacked body 1 manufactured in Example 2 is almost the same as a reflectance graph (Before Test) before the water resistance test. This means that even after the stacked bodies 1 manufactured in Examples 1 and 2 were in contact with moisture, the colors or the glossiness of the stacked bodies were almost unchanged.

As a result, it was confirmed that the stacked bodies 1 manufactured in Examples 1 and 2 (i) exhibited a specific color and glossiness, (ii) may transmit electromagnetic waves, and (iii) had excellent water resistance.

Although the present invention has been described with the accompanying drawings, the present invention is only one embodiment of various embodiments including the gist of the present invention and for the purpose to be easily implemented by those skilled in the art, and it will be apparent to those skilled in the art that the present invention is not limited to the above-described embodiments. Therefore, the scope of the present invention should be construed according to the following claims, and all technical ideas within the equal scope thereto will be included in the scope of equivalence by changes, substitutions, replacements, and the like without departing from the gist of the present invention. Further, it should be apparent that some configurations of the drawings are intended to explain the configuration more clearly and are provided in a more exaggerated or reduced size than the actual configuration.

REFERENCE SIGNS LIST

1: Stacked body
10: Substrate
20: Primer coating layer
30: Deposition layer
310: Ceramic layer
311: High refractive index layer
311a: First high refractive index layer
311b: Second high refractive index layer
312: Low refractive index layer
312a: First low refractive index layer
312b: Second low refractive index layer
320: Germanium layer
330: Organic material layer
340: Zinc compound layer
340a: First zinc compound layer
340b: Second zinc compound layer
350: Chromium oxide layer
40: Black shield coating layer

The invention claimed is:

1. A sensor cover laminate configured for matching a vehicle color while also passing electromagnetic waves, the sensor cover laminate comprising:
   a transparent substrate to pass light;
   a primer coating layer that is transparent or translucent on the transparent substrate to pass light;
   a deposition layer on the primer coating layer to reflect light and to exhibit glossiness; and
   a black shield coating layer on the deposition layer to block light and to have black color,
   wherein the deposition layer includes:
   a germanium (Ge) layer to exhibit glossiness and to transmit electromagnetic waves, and a first ceramic layer having a different refractive index and covering the germanium layer;
   wherein the first ceramic layer includes at least one high refractive index layer made of titanium dioxide (TiO2) or Ti3O5 to have a refractive index of 1.7 to 2.6 and at least one low refractive index layer made of silicon dioxide (SiO2) to have a refractive index of 1.4 to 1.7;
   wherein the high refractive index layer and the low refractive index layer are formed alternatively by deposition between the germanium layer;
   wherein a color and brightness of the sensor cover laminate is controlled by a thickness of the first ceramic layer and the germanium layer corresponding to a refractive index of the high refractive index layer and the low refractive index layer; and wherein the sensor cover laminate is configured to transmit an electromagnetic wave through the sensor cover laminate with an attenuation less than 10% at 76.5 GHz of frequency domain.

2. The sensor cover laminate of claim 1, wherein the germanium layer is made of pure germanium (Ge).

3. The sensor cover laminate of claim 1, wherein the germanium layer is made of germanium alloy, wherein the germanium alloy is formed of 50 to 99 wt % of the germanium and 1 to 50 wt % of one or more elements selected from the group consisting of Au, Ag, B, Al, Ga, In, Sn, Tl belonging to Groups 3B to 5A of the periodic table to have metal glossiness and to enhance metal strength.

4. The sensor cover laminate of claim 1, wherein the thickness of the germanium layer is 150 to 800 Å to prevent peeling of the germanium layer and to enhance a transmitting rate of the electromagnetic wave.

5. The sensor cover laminate of claim 1, wherein the transparent substrate is made of at least one material selected from the group consisting of polycarbonate (PC), polymethylmethacrylate (PMMA), polyethylene terephthalate (PET), polyethylene naphthalate (PEN), polyimide (PI), cycloolefin polymer (COP), polyether sulfone (PES), polyetheretherketone (PEEK), polyarylate (PAR), an ABS resin, and a silicone resin.

6. The sensor cover laminate of claim 1, wherein the deposition layer further includes the following layers to have a black color:
a first zinc compound layer deposited on one side of the germanium layer and made of zinc sulfide (ZnS) or zinc selenide (ZnSe);
a second zinc compound layer deposed on an other side of the germanium layer and made of zinc sulfide (ZnS) or zinc selenide (ZnSe);
an organic material layer deposited on the first zinc compound layer from the other side of the germanium layer to enhance water resistance and moisture resistance; and
a chromium oxide layer deposited on the second zinc compound layer from the other side of the germanium layer to protect the deposition layer, to prevent water penetration to the germanium layer and to enhance the adhesion between the deposition layer and the black shield coating layer.

7. The sensor cover laminate of claim 6, wherein the thickness of the organic material layer is 50 to 400 Å to make the germanium layer have metal glossiness and to enhance water resistance and moisture resistance.

8. The sensor cover laminate of claim 6, wherein a thickness of the germanium layer is 150 to 800 Å to prevent peeling of the germanium layer and to enhance a transmitting rate of the electromagnetic wave.

9. The sensor cover laminate of claim 6, wherein a thickness of the first zinc compound layer and the second zinc compound layer is 100 to 600 Å, the first zinc compound layer and the second zinc compound layer are deposited between the germanium layer to protect the germanium layer and to enhance water resistance and moisture resistance, and the sensor cover laminate is configured to transmit an electromagnetic wave through the sensor cover laminate with an attenuation of less than 10% at 76.5 GHz of frequency domain.

10. The sensor cover laminate of claim 6, wherein a thickness of the chromium oxide layer is 50 to 400 Å to protect the deposition layer and to enhance a transmitting rate of the electromagnetic wave.

11. The sensor cover laminate of claim 6, comprising:
a second ceramic layer deposited on the organic material layer from the other side of the germanium layer.

12. The sensor cover laminate of claim 11, wherein the second ceramic layer is formed by depositing a first high refractive index layer, a first low refractive index layer, a second high refractive index layer, and a second low refractive index layer in sequence.

13. The sensor cover laminate of claim 11, wherein a thickness of the first high refractive index layer is 50 to 400 Å, a thickness of the first low refractive index layer is 150 to 800 Å, a thickness of the second high refractive index layer is 175 to 900 Å, and a thickness of the second low refractive index layer is 225 to 1100 Å to make the deposition layer have silver color.

14. The sensor cover laminate of claim 11, wherein a thickness of the organic material layer is 50 to 400 Å to make the germanium layer have metal glossiness and to enhance water resistance and moisture resistance.

15. The sensor cover laminate of claim 11, wherein a thickness of the first zinc compound layer and the second zinc compound layer is 100 to 600 Å, the first zinc compound layer and the second zinc compound layer are deposited between the germanium layer to protect the germanium layer and to enhance water resistance and moisture resistance, and the sensor cover laminate is configured to transmit an electromagnetic wave through the sensor cover laminate with an attenuation of less than 10% at 76.5 GHz of frequency domain.

* * * * *